United States Patent
Nakatsu et al.

(10) Patent No.: US 12,265,107 B2
(45) Date of Patent: Apr. 1, 2025

(54) RESISTANCE DETECTION SENSOR

(71) Applicant: NIPPON PILLAR PACKING CO., LTD, Osaka (JP)

(72) Inventors: Akira Nakatsu, Osaka (JP); Kentaro Watanabe, Osaka (JP)

(73) Assignee: PILLAR CORPORATION, Osaka (JP)

( * ) Notice: Subject to any disclaimer, the term of this patent is extended or adjusted under 35 U.S.C. 154(b) by 61 days.

(21) Appl. No.: 18/329,314

(22) Filed: Jun. 5, 2023

(65) Prior Publication Data
US 2024/0003949 A1   Jan. 4, 2024

(30) Foreign Application Priority Data

Jun. 30, 2022   (JP) ................................. 2022-105583

(51) Int. Cl.
*G01R 27/08*   (2006.01)
*G01N 27/06*   (2006.01)
*G01R 27/22*   (2006.01)

(52) U.S. Cl.
CPC ............. *G01R 27/22* (2013.01); *G01N 27/06* (2013.01)

(58) Field of Classification Search
CPC ...... G01N 27/06; G01N 27/08; G01N 27/028; G01N 27/22; G01N 27/221; G01N 27/28; G01N 33/2888; G01N 33/28
See application file for complete search history.

(56) References Cited

U.S. PATENT DOCUMENTS

| | | | | |
|---|---|---|---|---|
| 4,853,638 | A * | 8/1989 | Endou | G01N 33/18 324/439 |
| 2004/0095154 | A1* | 5/2004 | Lundstrom | G01N 33/246 324/694 |
| 2012/0304743 | A1* | 12/2012 | Rajasekharan | G01N 27/07 73/61.41 |
| 2024/0060923 | A1* | 2/2024 | Nagai | G01N 27/07 |

FOREIGN PATENT DOCUMENTS

| | | |
|---|---|---|
| JP | H06307915 A | 11/1994 |
| JP | 3769119 B2 | 4/2006 |
| JP | 6295018 B2 | 3/2018 |

* cited by examiner

*Primary Examiner* — Thang X Le
(74) *Attorney, Agent, or Firm* — NKL Law; Allen Xue (57) ABSTRACT

The resistance detection sensor is configured to detect the electrical resistance value of a liquid. This resistance detection sensor includes a pair of electrodes, a DC voltage application unit, an AC voltage application unit, and a control unit. The pair of electrodes are immersed in a liquid. The DC voltage application unit applies a DC voltage having a first polarity between the pair of electrodes. The AC voltage application unit applies an AC voltage between the pair of electrodes. The control unit calculates the electrical resistance value of the liquid, in a state where the DC voltage is applied between the pair of electrodes by the DC voltage application unit. The control unit controls the AC voltage application unit so as to apply an AC voltage starting from a second polarity opposite to the first polarity at a predetermined time interval between the pair of electrodes. The time period for which the AC voltage is applied between the pair of electrodes by the AC voltage application unit is not an integer multiple of the cycle of the AC voltage applied between the pair of electrodes.

8 Claims, 8 Drawing Sheets

RESISTANCE DETECTION SENSOR

TECHNICAL FIELD

The present invention relates to a resistance detection sensor.

BACKGROUND ART

Japanese Patent No. 3769119 (Patent Document 1) discloses a liquid purity monitoring apparatus. This purity monitoring device includes a sensor unit. An amplifier is constituted in the sensor unit, and the sensor unit includes an internal electrode and an external electrode. In this purity monitoring device, a voltage is applied between the electrodes with the internal electrode and the external electrode immersed in a liquid, and the electrical resistance value of the liquid is calculated based on the output voltage of the amplifier (See Patent Document 1).

Japanese Patent No. 3769119 is an example of related art.

With the technology disclosed in Patent Document 1, an AC voltage is applied between the electrodes, when calculating the electrical resistance value of a liquid containing water, for example. However, the detection accuracy of the electrical resistance value of a liquid with the method that calculates the electrical resistance value by applying an AC voltage between the electrodes is generally known to be lower than the detection accuracy of the electrical resistance value of a liquid with a method that calculates the electrical resistance value by applying a DC voltage between the electrodes. Also, the measurement range of electrical resistance values (e.g., $10^{-3}$ to $10^8$) of the method that calculates the electrical resistance value of a liquid by applying an AC voltage between the electrodes is generally known to be narrower than the measurement range of electrical resistance values (e.g., $10^{-8}$ to $10^{16}$) of the method that calculates the electrical resistance value of a liquid by applying a DC voltage between the electrodes.

On the other hand, when a DC voltage is applied between the electrodes in order to calculate the electrical resistance value of a liquid containing water, for example, electrolysis of the water in the liquid and polarization of the components constituting the liquid is promoted. As a result, an oxidation product or gas is produced on the surface of the electrodes, for example, and an error occurs in the calculation result of the electrical resistance value. That is, the detection accuracy of the electrical resistance value decreases.

The present invention has been made to solve such problems, and an object thereof is to provide a resistance detection sensor capable of suppressing a decrease in the detection accuracy of the electrical resistance value of a liquid.

SUMMARY OF THE INVENTION

A resistance detection sensor according to the present invention is configured to detect an electrical resistance value of a liquid. This resistance detection sensor includes a pair of electrodes, a DC voltage application unit, an AC voltage application unit, and a control unit. The pair of electrodes are immersed in the liquid. The DC voltage application unit is configured to apply a DC voltage having a first polarity between the pair of electrodes. The AC voltage application unit is configured to apply an AC voltage between the pair of electrodes. The control unit is configured to calculate the electrical resistance value of the liquid, in a state where the DC voltage is applied between the pair of electrodes by the DC voltage application unit. The control unit controls the AC voltage application unit so as to apply an AC voltage starting from a second polarity opposite to the first polarity at a predetermined time interval between the pair of electrodes. The time period for which the AC voltage is applied between the pair of electrodes by the AC voltage application unit is not an integer multiple of a cycle of the AC voltage that is applied between the pair of electrodes.

In this resistance detection sensor, an AC voltage starting from a second polarity opposite to a first polarity is applied between a pair of electrodes at a predetermined time interval, and the time period for which the AC voltage is applied between the pair of electrodes is not an integer multiple of the cycle of the AC voltage that is applied between the pair of electrodes. Accordingly, with this resistance detection sensor, since a voltage of opposite polarity to the polarity of the voltage that is applied in order to calculate the electrical resistance value of the liquid is applied between the pair of electrodes at a predetermined time interval, the occurrence of polarization can be suppressed. As a result, according to this resistance detection sensor, a decrease in the detection accuracy of the electrical resistance value of the liquid can be suppressed.

In the above resistance detection sensor, the time period for which an AC voltage is applied between the pair of electrodes by the AC voltage application unit may be a time period consisting of a time period of an integer multiple of the cycle of the AC voltage that is applied between the pair of electrodes added to a time period of half the cycles of the AC voltage that is applied between the pair of electrodes.

According to this resistance detection sensor, since a voltage of opposite polarity the polarity of the voltage that is applied in order to calculate the electrical resistance value of the liquid is maximally applied between the pair of electrodes, the occurrence of polarization can be further suppressed. As a result, according to this resistance detection sensor, a decrease in the detection accuracy of the electrical resistance value of the liquid can be further suppressed.

The resistance detection sensor may further include an operational amplifier. In the resistance detection sensor, an amplifier circuit including the operational amplifier may be constituted. One electrode of the pair of electrodes may be connected to an input side of the operational amplifier, and the other electrode of the pair of electrodes may be connected to an output side of the operational amplifier. The control unit may calculate the electrical resistance value of the liquid based on an output voltage of the operational amplifier.

In the above resistance detection sensor, a cycle in which calculation of the electrical resistance value of the liquid is performed may be the same as a cycle in which the AC voltage is applied between the pair of electrodes.

According to this resistance detection sensor, since the cycle in which calculation of the electrical resistance value of the liquid is performed is the same as the cycle in which the AC voltage is applied between the pair of electrodes, the occurrence of polarization can be suppressed as it arises. As a result, according to this resistance detection sensor, a decrease in the detection accuracy of the electrical resistance value of the liquid can be suppressed.

In the above resistance detection sensor, the liquid may be a liquid lubricant.

According to this resistance detection sensor, since a voltage of opposite polarity to the polarity of the voltage that is applied in order to calculate the electrical resistance value of the liquid lubricant is applied between the pair of electrodes at a predetermined time interval, the occurrence of polarization can be suppressed. As a result, according to this resistance detection sensor, a decrease in the detection accuracy of the electrical resistance value of the liquid lubricant can be suppressed.

According to the present invention, a resistance detection sensor capable of suppressing a decrease in the detection accuracy of the electrical resistance value of a liquid can be provided.

EMBODIMENTS OF THE INVENTION

Hereinafter, an embodiment according to one aspect of the present invention (hereinafter also referred to as "the present embodiment") will be described in detail using the drawings. Note that the same or equivalent portions will be given the same reference numerals and description thereof will not be repeated. Also, for ease of understanding, the diagrams are schematically depicted with certain portions omitted or shown in an exaggerated manner as appropriate.

1. Configuration of Resistance Detection Sensor

Figure 1:
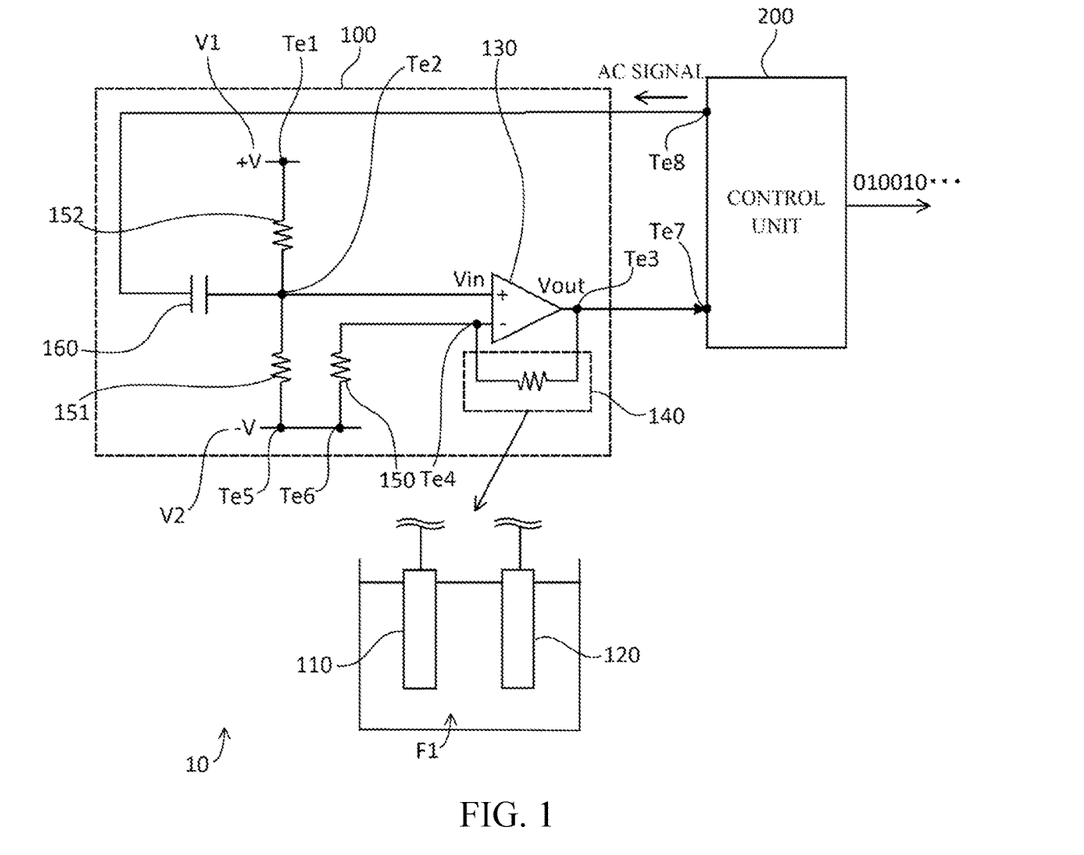
FIG. 1 is a diagram schematically shows an electrical configuration of part of a resistance detection sensor.

FIG. 1 is a diagram schematically showing an electrical configuration of part of a resistance detection sensor 10 according to the present embodiment. Referring to FIG. 1, the resistance detection sensor 10 is configured to detect the electrical resistance value of a liquid.

Examples of the liquid include a liquid lubricant such as mineral oil, synthetic oil, an animal or vegetable oil and a water-based lubricant, a semi-solid lubricant such as lithium soap grease, calcium soap grease, urea grease and silicon grease, and an aqueous solution such as hydrochloric acid. Liquid lubricants include, for example, hydraulic fluid, gear oil, turbine oil, bearing lubricating oil, guideway oil, compressor oil, refrigeration oil, plastic working oil, heat treatment oil, cutting oil, engine oil, ATF (Automatic Transmission Fluid), CVTF (Continuously Variable Transmission Fluid) and brake fluid.

The resistance detection sensor 10 includes a sensor unit 100 and a control unit 200. The sensor unit 100 includes a positive power source V1, a negative power source V2, an operational amplifier 130, a resistance detection unit 140, resistors 150, 151 and 152, and a capacitor 160.

The positive power source V1 is electrically connected to a terminal Te2 via a terminal Te1 and the resistor 152. The terminal Te2 is electrically connected to a positive terminal of the operational amplifier 130, and is electrically connected to the negative power source V2 via the resistor 151 and a terminal Te5. Also, the terminal Te2 is electrically connected to a terminal Te8 of the control unit 200 via the capacitor 160. The terminal Te8 is an output terminal of the control unit 200.

While a detailed description will be given later, the control unit 200 is configured to apply an AC voltage to the sensor unit 100 at a predetermined time interval. The control unit 200 receives power supply from an AC power source external to the resistance detection sensor 10, for example, and applies an AC voltage to the sensor unit 100. Due to the AC voltage being applied to the sensor unit 100, an AC signal is output from the terminal Te8.

Also, the negative power source V2 is electrically connected to a negative terminal of the operational amplifier 130 via the terminal Te5, a terminal Te6, the resistor 150, and a terminal Te4. The operational amplifier 130 is electrically connected to a terminal Te1 of the control unit 200 via a terminal Te3. The terminal Te1 is an input terminal of the control unit 200. The terminal Te3 is connected to the terminal Te4 via the resistance detection unit 140.

The resistance detection unit 140 includes electrodes 110 and 120. The electrodes 110 and 120 constitute a pair of electrodes. The electrodes 110 and 120 are both constituted by a ground plane containing a metal, for example. The electrodes 110 and 120 are both immersed in a liquid F1. That is, in the resistance detection sensor 10, the positive power source V1, the negative power source V2, the operational amplifier 130, the resistance detection unit 140, and the resistors 150, 151 and 152 constitute a non-inverting amplifier circuit.

In the resistance detection sensor 10, the voltage values of both the positive power source V1 and the negative power source V2 are known, and the resistance values of both the resistors 151 and 152 are known. Accordingly, an input voltage Vin of the operational amplifier 130 is known, at least in a state where an AC voltage is not being applied to the sensor unit 100. Also, the resistance value of the resistor 150 is known. When the resistance value of the resistor 150 is given as R1 and the resistance value in the resistance detection unit 140 is given R2, the relation of the following equation (1) holds in the non-inverting amplifier circuit.

Output voltage $V\text{out}$ of operational amplifier 130= $(R1+R2)V\text{in}/R1$     (1)

Since R1 and Vin are known, the control unit 200 is able to calculate R2, by detecting the output voltage Vout of the operational amplifier 130. That is, in the resistance detection sensor 10, the electrical resistance value of the liquid F1 is detected, based on the output voltage Vout of the operational amplifier 130 in a state where a DC voltage originating in the positive power source V1 is applied between the electrodes 110 and 120.

The control unit 200 includes a CPU (Central Processing Unit), a RAM (Random Access Memory), and a ROM (Read Only Memory), for example. The control unit 200 controls the constituent elements within the resistance detection sensor 10, according to information processing, for example.

Also, as described above, the control unit 200 calculates the electrical resistance value of the liquid F1 based on the output voltage Vout (analog signal) of the operational amplifier 130, for example. The control unit 200 converts the analog signal into a digital signal in the calculation process, and performs control for outputting the digital signal to outside the resistance detection sensor for example.

Also, as described above, the control unit 200 receives power supply from an AC power source external to the resistance detection sensor 10, and performs control for applying an AC voltage to the sensor unit 100 at a predetermined time interval, for example. The reason for an AC voltage being applied to the sensor unit 100 at a predetermined time interval will be described next.

Note that, in the resistance detection sensor 10, power supply to the operational amplifier 130 is performed by the positive power source V1 and the negative power source V2. That is, the positive power source V1 is connected to a positive-side power source voltage application terminal of the operational amplifier 130, and the negative power source V2 is connected to a negative-side power source voltage application terminal of the operational amplifier 130. Power supply to the control unit 200 may also be performed by the positive power source V1, or by another power source, for example.

2. Suppression of Decrease in Detection Accuracy of Electrical Resistance Value FIG. 2 is a diagram for describing the kinds of issues that arise if an AC voltage is not applied at a predetermined time interval.

Figure 2:
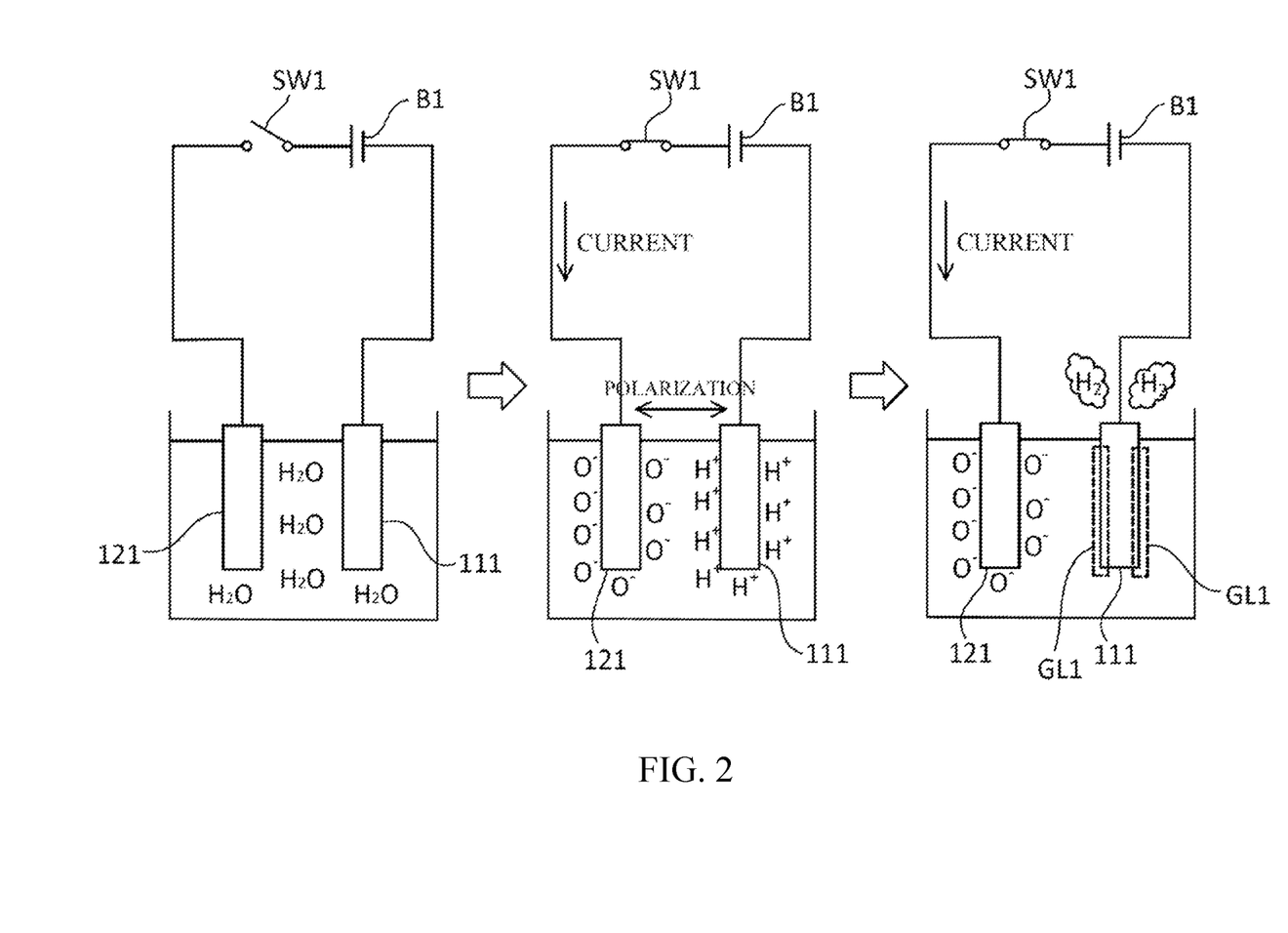
FIG. 2 is a diagram for describing the kinds of issues that arise if an AC voltage is not applied at a predetermined time interval.

Referring to the left portion of FIG. 2, electrodes 121 and 111 are immersed in a liquid containing water. The electrodes 121 and 111 both contain a metal, for example. The electrode 121 is connected to a cathode of a battery B1 via a switch SW1, and the electrode 111 is connected to an anode of the battery B1. The switch SW1 is open. In this state, much of the water in the liquid exists as water ($H_2O$).

Referring to the middle portion of FIG. 2, due to the switch SW1 being closed, a DC voltage is applied between the electrodes 121 and 111 and a current is produced. When a DC voltage is applied between the electrodes 121 and 111, electrolysis of the water contained in the liquid and polarization of both the electrodes 121 and 111 are promoted. Oxygen ions produced by the electrolysis of the water are attracted to the electrode 121, and hydrogen ions produced by the electrolysis of the water are attracted to the electrode 111.

Referring to the right portion of FIG. 2, when the closed state of the switch SW1 is continued, an oxidation product (rust) is generated on an outer peripheral portion of the electrode 121, and a gas layer of hydrogen GL1 is formed around the electrode 111.

Referring again to FIG. 1, when only a DC voltage is continuously applied between the electrodes 110 and 120, without an AC voltage being applied between the electrodes 110 and 120 at a predetermined time interval, issues such as illustrated in FIG. 2 can arise. That is, an oxidation product is generated on an outer peripheral portion of the electrode 120, and a hydrogen gas layer is formed around the electrode 110. An error thereby occurs in the calculation result of the electrical resistance value of the liquid F1, and the detection accuracy of the electrical resistance value of the liquid F1 decreases.

Figure 3:
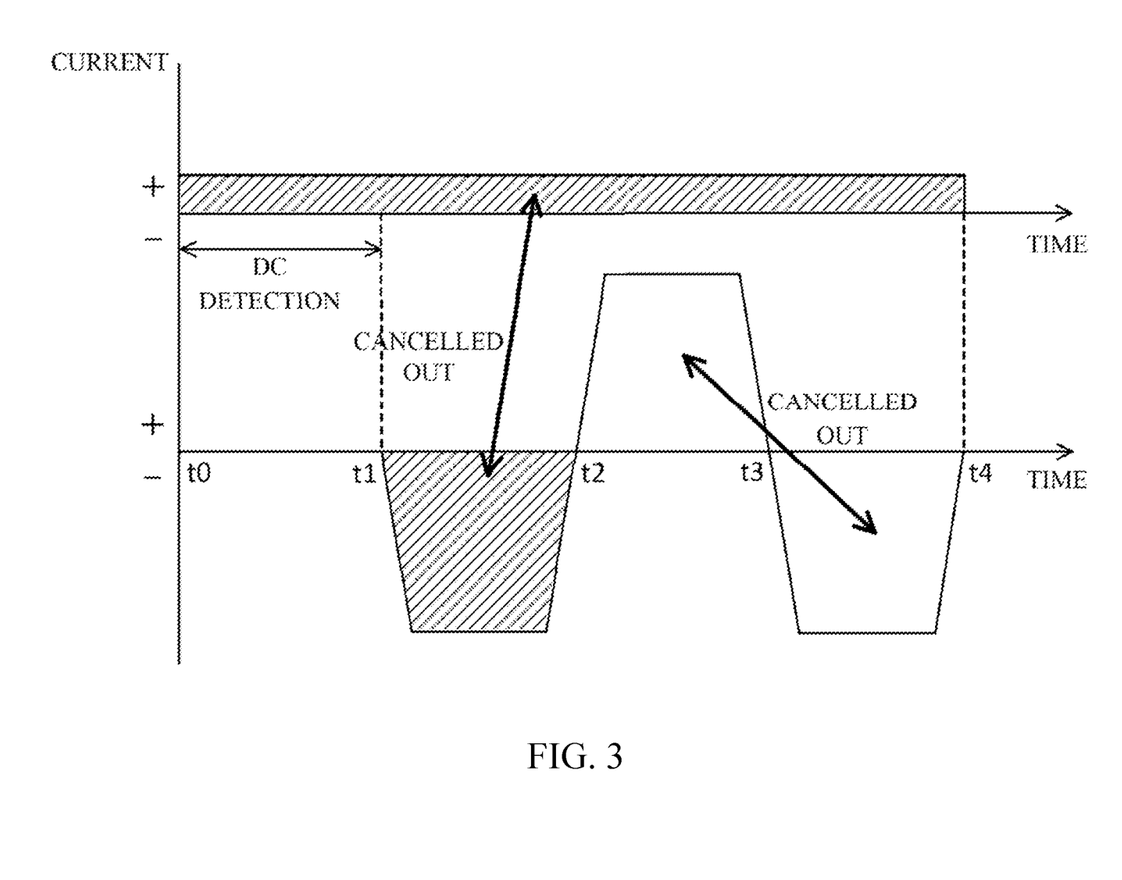
FIG. 3 is a diagram for describing the effect obtained by applying an AC voltage between electrodes at a predetermined time interval.

FIG. 3 is a diagram for describing the effect obtained by applying an AC voltage between the electrodes 110 and 120 at a predetermined time interval. Referring to FIG. 3, the horizontal axis shows time and the vertical axis shows current. The upper portion of FIG. 3 shows the transition of direct current that is produced between the electrodes 110 and 120 during times t0 to t4. The lower portion of FIG. 3 shows the transition of alternating current that is produced between the electrodes 110 and 120 during times t0 to t4.

From times t0 to t1, only direct current is produced between the electrodes 110 and 120. That is, from times t0 to t1, only a DC voltage is applied between the electrodes 110 and 120, and an AC voltage is not applied between the electrodes 110 and 120. The control unit 200 calculates the electrical resistance value in the resistance detection unit 140 based on the output voltage Vout of the operational amplifier 130 from times t0 to t1.

From times t1 to t4, a current consisting of the alternating current shown in the lower portion of FIG. 3 added to the direct current shown in the upper portion of FIG. 3 is produced between the electrodes 110 and 120. That is, from times t1 to t4, both a DC voltage and an AC voltage are applied between the electrodes 110 and 120. The purpose of applying an AC voltage between the electrodes 110 and 120 from times t1 to t4 is to suppress polarization of the electrodes caused by the DC voltage applied between the electrodes 110 and 120 from times t0 to t4.

From times t0 to t4, a DC voltage having a first polarity (positive polarity) is applied between the electrodes 110 and 120. From times t1 to t4, an AC voltage starting from a second polarity (negative polarity) opposite to the first polarity is applied between the electrodes 110 and 120. The polarity of the AC voltage is reversed from negative to positive at time t2, and the polarity of the AC voltage is reversed from positive to negative at time t3. That is, in this example, the time period for which an AC voltage is applied between the electrodes 110 and 120 is a time period consisting of the time period of an integer multiple (1 times) of the cycle of the AC voltage that is applied between the electrodes 110 and 120 added to the time period of half the cycles of the AC voltage that is applied between the electrodes 110 and 120.

The influence of the AC voltage on the polarization of both the electrodes 110 and 120 from times t2 to t3 is cancelled out by the influence of the AC voltage on the polarization of both the electrodes 110 and 120 from times t3 to t4. Also, the influence of the DC voltage on the polarization of both the electrodes 110 and 120 from times t0 to t4 is cancelled out by the influence of the AC voltage on the polarization of both the electrodes 110 and 120 from times t1 to t2.

That is, both the frequency and amplitude of the AC voltage that is applied between the electrodes 110 and 120 are set such that the influence of the DC voltage that is applied between the electrodes 110 and 120 on the polarization of the electrodes is canceled out, for example. Note that the influence of the DC voltage on the polarization of the electrodes need not necessarily be completely cancelled out by the AC voltage that is applied between the electrodes 110 and 120, and the influence of the DC voltage on the polarization of the electrodes need only be suppressed as much as possible.

Note that the control unit 200 may determine whether the AC voltage that is applied between the electrodes 110 and 120 started from the second polarity (negative polarity) opposite to the first polarity. For example, a voltage sensor (not shown) that detects the input voltage Vin or the output voltage Vout of the operational amplifier 130 may be provided, and the control unit 200 may determine whether the AC voltage that is applied between the electrodes 110 and 120 started from the second polarity, based on the detection result of the voltage sensor. Also, a current sensor (not shown) that detects a current that is produced in the resistance detection unit 140 may be provided, and the control unit 200 may determine whether the AC voltage that is applied between the electrodes 110 and 120 started from the second polarity, based on the detection result of the current sensor. The control unit 200 may, for example, perform control for conveying a warning to the user, if it is determined that the AC voltage that is applied between the electrodes 110 and 120 did not start from the second polarity.

Figure 4:
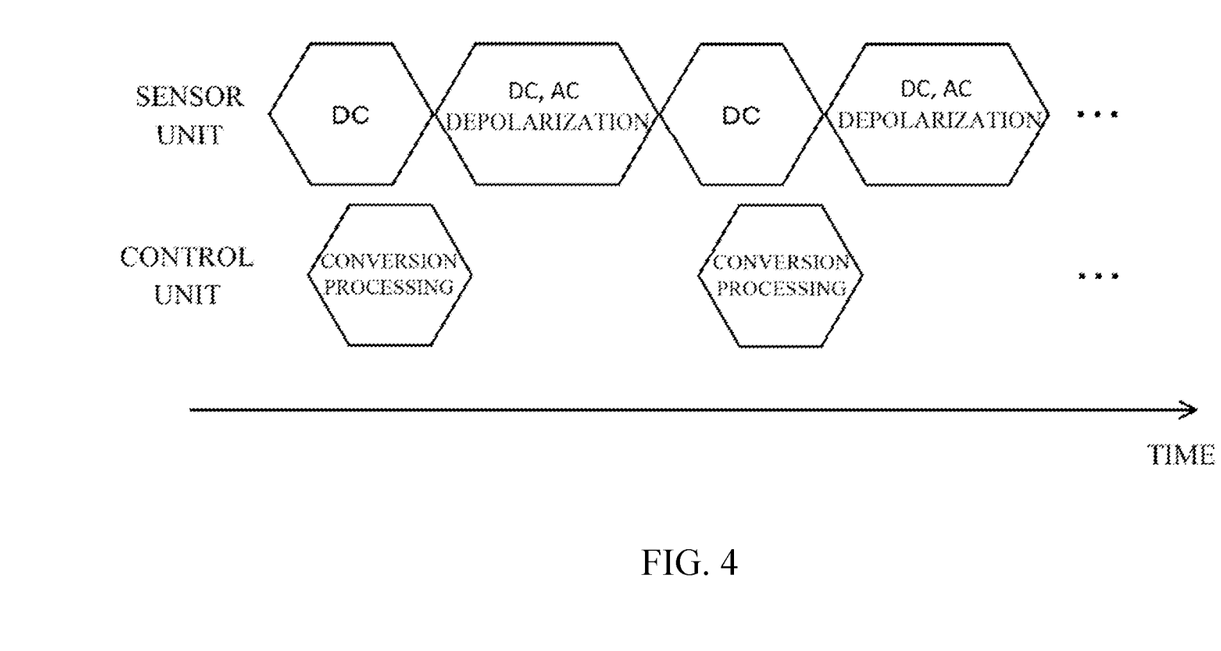
FIG. 4 is a diagram for describing respective operations of a sensor unit and a control unit.

FIG. 4 is a diagram for describing the operations of both the sensor unit 100 and the control unit 200. Referring to FIG. 4, the upper portion shows the operations of the sensor unit 100, and the lower portion shows the operations of the control unit 200.

In the sensor unit 100, a state in which only a DC (Direct Current) voltage is applied between the electrodes 110 and 120 and a state in which both a DC voltage and an AC (Alternating Current) voltage are applied between the electrodes 110 and 120 are repeated at a predetermined cycle. In the state where both the DC voltage and AC voltage are applied between the electrodes 110 and 120, polarization of both the electrodes 110 and 120 is suppressed.

In the control unit 200, the electrical resistance value of the liquid F1 (FIG. 1) is calculated at a predetermined cycle, based on the output voltage Vout of the operational amplifier 130 in the state where only a DC voltage is applied between the electrodes 110 and 120. Calculation of the electrical resistance value may involve conversion processing of the analog signal to the digital signal.

As shown in FIG. 4, the cycle in which calculation of the electrical resistance value of the liquid F1 is performed is the same as the cycle in which the AC voltage is applied between the pair of electrodes 110 and 120. According to the resistance detection sensor 10, since the cycle in which calculation of the electrical resistance value of the liquid F1 is performed is the same as the cycle in which the AC voltage is applied between the pair of electrodes 110 and 120, the occurrence of polarization of both the electrodes 110 and 120 can be suppressed as it arises. As a result, according to the resistance detection sensor 10, a decrease in the detection accuracy of the electrical resistance value of the liquid F1 can be suppressed.

3. Operations of Resistance Detection Sensor

Figure 5:
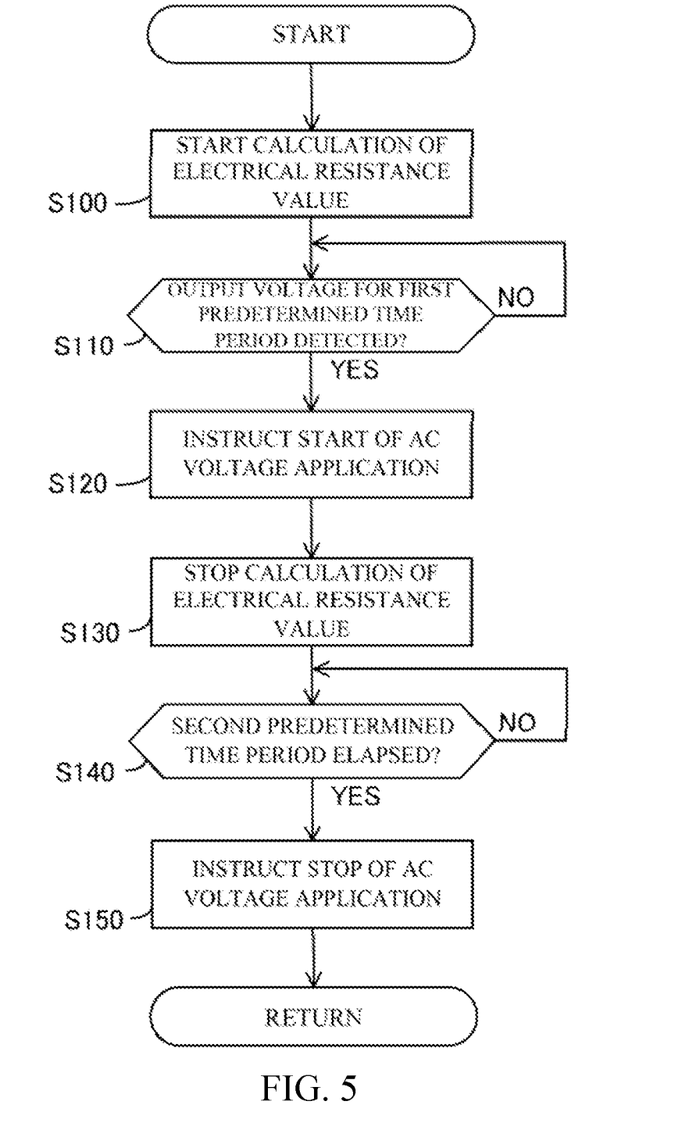
FIG. 5 is a flowchart showing an example of an operation procedure in the resistance detection sensor.

FIG. 5 is a flowchart illustrating an example of an operation procedure in the resistance detection sensor 10. The processing shown in this flowchart starts in the state where only a DC voltage is applied between the electrodes 110 and 120, and is repeatedly executed at a predetermined cycle by the control unit 200.

Referring to FIG. 5, the control unit 200 starts calculation of the electrical resistance value of the liquid F1 that is based on the output voltage Vout of the operational amplifier 130 (step S100). That is, the control unit 200 generates an electrical resistance value (digital signal) of the liquid F1 based on the detected output voltage Vout (analog signal), and sequentially outputs the generated digital signal (electrical resistance value) to outside the resistance detection sensor 10. Note that the control unit 200 does not necessarily need to sequentially output the generated digital signal to outside the resistance detection sensor 10. For example, the control unit 200 may use the generated digital signal inside the resistance detection sensor 10, or may output the digital signal to outside the resistance detection sensor 10 at the stage at which a digital signal of a certain capacity is generated.

The control unit 200 starts detection of the output voltage Vout of the operational amplifier 130, and determines whether a first predetermined time period has elapsed (step S110). The first predetermined time period is a predetermined time period, and is a time period for which the electrical resistance value of the liquid F1 is continuously calculated in one cycle of this flowchart.

When it is determined that the first predetermined time period has not elapsed after starting detection of the output voltage Vout of the operational amplifier 130 (NO in step S110), the control unit 200 continues calculation of the electrical resistance value of the liquid F1. On the other hand, when it is determined in step S110 that the first predetermined time period has elapsed after starting detection of the output voltage Vout of the operational amplifier 130 (YES in step S110), the control unit 200 performs control for applying an AC voltage between the electrodes 110 and 120 (step S120). When calculation of the electrical resistance value of the liquid F1 that is based on the output voltage Vout for the first predetermined time period is completed, the control unit 200 stops calculation of the electrical resistance value of the liquid F1 (step S130). The control unit 200 determines whether a second predetermined time period has elapsed after application of the AC voltage between the electrodes 110 and 120 was started (step S140). The second predetermined time period is a time period determined in advance, and is a time period consisting of the time period of an integer multiple (1 times) of the cycle of the AC voltage that is applied between the electrodes 110 and 120 added to the time period of half the cycles of the AC voltage that is applied between the electrodes 110 and 120.

When it is determined that the second predetermined time period has not elapsed after application of the AC voltage between the electrodes 110 and 120 was started (NO in step S140), the control unit 200 waits until the second predetermined time period elapses. On the other hand, when it is determined that the second predetermined time period has elapsed after application of the AC voltage between the electrodes 110 and 120 was started (YES in step S140), the control unit 200 performs control for stopping application of the AC voltage between the electrodes 110 and 120 (step S150). Thereafter, the control unit 200 again executes the processing of step S100.

4. Features

As described above, in the resistance detection sensor 10 according to the present embodiment, an AC voltage that starts from the opposite polarity (negative polarity) to the polarity (positive polarity) of the DC voltage is applied between the electrodes 110 and 120 at a predetermined time interval, and the time period for which the AC voltage is applied between the electrodes 110 and 120 is not an integer multiple of the cycle of the AC voltage that is applied between the electrodes 110 and 120. Accordingly, with the resistance detection sensor 10, since a voltage of opposite polarity to the DC voltage that is applied in order to calculate the electrical resistance value of the liquid F1 is applied between the electrodes 110 and 120 at a predetermined time interval, the occurrence of polarization can be suppressed. As a result, according to the resistance detection sensor 10, a decrease in the detection accuracy of the electrical resistance value of the liquid F1 can be suppressed.

Also, in the resistance detection sensor 10, the time period for which the AC voltage is applied between the electrodes 110 and 120 at a predetermined time interval is a time period consisting of the time period of an integer multiple (e.g., 1 times) of the cycle of the AC voltage that is applied between the electrodes 110 and 120 added to the time period of half the cycles of the AC voltage that is applied between the electrodes 110 and 120. Accordingly, with the resistance detection sensor 10, since a voltage of opposite polarity to the polarity of the DC voltage that is applied in order to calculate the electrical resistance value of the liquid F1 is maximally applied between the electrodes 110 and 120, the occurrence of polarization can be further suppressed. As a result, according to the resistance detection sensor 10, a decrease in the detection accuracy of the electrical resistance value of the liquid F1 can be further suppressed.

Also, according to the resistance detection sensor 10, since the cycle in which calculation of the electrical resistance value of the liquid F1 is performed is the same as the cycle in which the AC voltage is applied between the pair of electrodes 110 and 120, the occurrence of polarization can be suppressed as it arises. As a result, according to the resistance detection sensor 10, a decrease in the detection accuracy of the electrical resistance value of the liquid F1 can be suppressed.

Note that the resistance detection sensor 10 is an example of the "resistance detection sensor" in the present invention. Also, the electrodes 110 and 120 are examples of the "pair of electrodes" in the present invention. Also, the configuration including the positive power source V1 and the negative power source V2 is an example of the "DC voltage application unit" in the present invention. Also, at least a portion of the control unit 200 is an example of the "AC voltage application unit" in the present invention. Also, at least a portion of the control unit 200 is an example of the "control unit" in the present invention. Also, the operational amplifier 130 is an example of the "operational amplifier" in the present invention. Also, the liquid F1 is an example of the "liquid" in the present invention.

5. Other Embodiments

The idea of the above embodiment is not limited to the embodiment described above. Hereinafter, examples of other embodiments to which the idea of the above embodiment can be applied will be described.

5-1. In the resistance detection sensor 10 according to the above embodiment, the waveform of the AC voltage that is applied between the electrodes 110 and 120 is a rectangular wave. However, the waveform of the AC voltage that is applied between the electrodes 110 and 120 does not necessarily need to be a rectangular wave. The waveform of the AC voltage that is applied between the electrodes 110 and 120 may be a sine wave, for example.

5-2. In the resistance detection sensor 10 according to the above embodiment, the time period for which the AC voltage is applied between the electrodes 110 and 120 is a time period consisting of the time period of 1 times the cycle of the AC voltage that is applied between the electrodes 110 and 120 added to the time period of half the cycles of the AC voltage that is applied between the electrodes 110 and 120. However, the time period for which the AC voltage is applied between the electrodes 110 and 120 is not limited thereto. The time period for which the AC voltage is applied between the electrodes 110 and 120 may, for example, be a time period consisting of the time period of an integer multiple of 2 or more times the cycle of the AC voltage that is applied between the electrodes 110 and 120 added to the time period of half the cycles of the AC voltage that is applied between the electrodes 110 and 120. Also, the time period for which an AC voltage is applied between the electrodes 110 and 120 may be the time period of half the cycles of the AC voltage that is applied between the electrodes 110 and 120.

Figure 6:
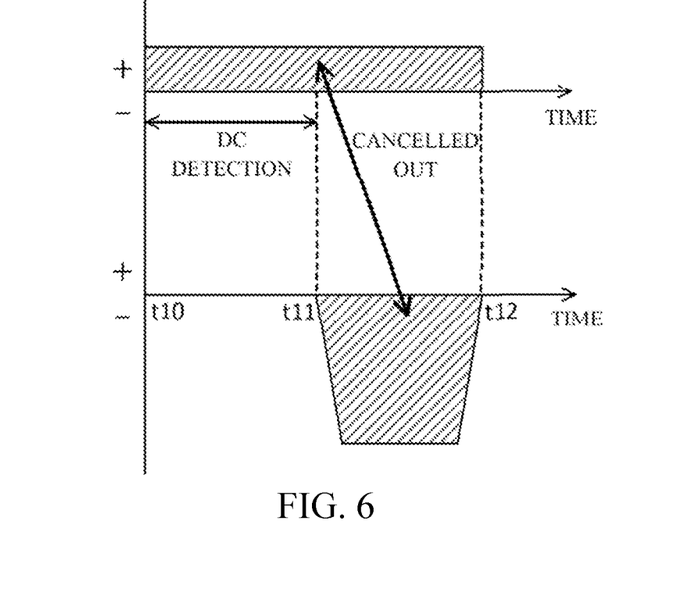
FIG. 6 is a diagram for describing an example in which the time period for which an AC voltage is applied between the electrodes is the time period of half the cycles of the AC voltage.

FIG. 6 is a diagram for describing an example in which the time period for which the AC voltage is applied between the electrodes 110 and 120 is the time period of half the cycles of the AC voltage. Referring to FIG. 6, the horizontal axis shows time and the vertical axis shows current. The upper portion of FIG. 6 shows the transition of direct current that is produced between the electrodes 110 and 120 during times t10 to t12. The lower portion of FIG. 6 shows the transition of alternating current that is produced between the electrodes 110 and 120 during times t10 to t12.

From times t10 to t11, only direct current is produced between the electrodes 110 and 120. That is, from times t10 to t11, only a DC voltage is applied between the electrodes 110 and 120, and an AC voltage is not applied between the electrodes 110 and 120. The control unit 200 calculates the electrical resistance value in the resistance detection unit 140 based on the output voltage Vout of the operational amplifier 130 from times t10 to t11.

From times t11 to t12, a current consisting of the alternating current shown in the lower portion of FIG. 6 added to the direct current shown in the upper portion of FIG. 6 is produced between the electrodes 110 and 120. That is, from times t11 to t12, both a DC voltage and an AC voltage are applied between the electrodes 110 and 120.

From times t10 to t12, a DC voltage having a first polarity (positive polarity) is applied between the electrodes 110 and 120. From times t11 to t12, an AC voltage starting from a second polarity (negative polarity) opposite to the first polarity is applied between the electrodes 110 and 120. For example, in this example, the time period for which the AC voltage is applied between the electrodes 110 and 120 is the time period of half the cycles of the AC voltage that is applied between the electrodes 110 and 120. This is sufficient as the time period for which the AC voltage is applied between the electrodes 110 and 120.

The influence of the DC voltage on the polarization of both the electrodes 110 and 120 from times t10 to t12 is cancelled out by the influence of the AC voltage on the polarization of both the electrodes 110 and 120 from times t11 to t12. Both the frequency and amplitude of the AC voltage that is applied between the electrodes 110 and 120 are set such that the influence of the DC voltage that is applied between the electrodes 110 and 120 on the polarization of the electrodes is cancelled out, for example. Note that the influence of the DC voltage on the polarization of the electrodes need not necessarily be completely cancelled out by the AC voltage that is applied between the electrodes 110 and 120, and the influence of the DC voltage on the polarization of the electrodes need only be suppressed as much as possible. In short, the time period for which an AC voltage is applied between the electrodes 110 and 120 need not be an integer multiple of the cycle of the AC voltage that is applied between the electrodes 110 and 120.

Figure 7:
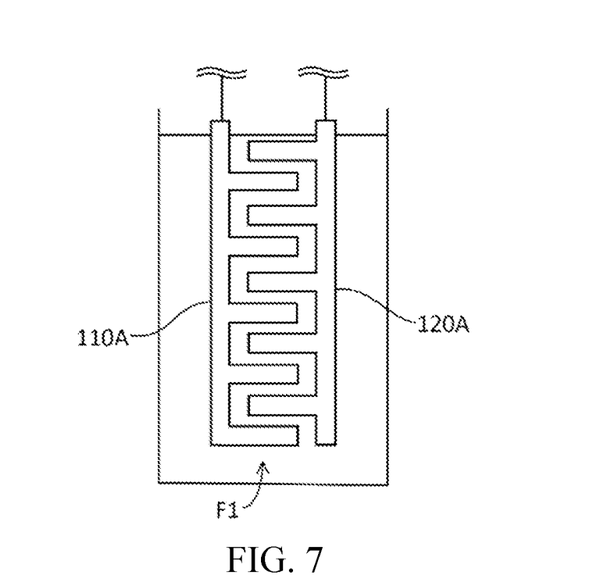
FIG. 7 is a diagram schematically showing another example of the electrodes that are used in the resistance detection unit.

5-3. FIG. 7 is a diagram schematically showing another example of the electrodes that are used in the resistance detection unit 140. As shown in FIG. 7, both electrodes 110A and 120A are immersed in the liquid F1. The electrodes 110A and 120A both have a comb tooth shape. The electrodes 110A and 120A are disposed such that their respective teeth are positioned in a staggered manner to each other. In the resistance detection sensor 10 according to the above embodiment, electrodes having a shape such as the electrodes 110A and 120A may be used instead of the electrodes 110 and 120. In short, the shape of both the electrodes 110 and 120 is not particularly limited. Note that, in the case where electrodes having a shape such as the electrodes 110A and 120A are used instead of the electrodes 110 and 120, the control unit 200 may detect the capacitance between the electrodes 110A and 120A, in a state where an AC voltage is applied between the electrodes 110A and 120A, for example. Also, the control unit 200 may calculate the electrical resistance value of the liquid F1, in a state where an AC voltage is applied between the electrodes 110A and 120A, for example.

5-4. In the resistance detection sensor 10 according to the above embodiment, a non-inverting amplifier circuit including the operational amplifier 130 is constituted in the sensor unit 100. However, the amplifier circuit constituted in the sensor unit 100 is not limited thereto. In the sensor unit 100, an inverting amplifier circuit including an operational amplifier may be constituted instead of a non-inverting amplifier circuit, for example. In this case, similarly to the above embodiment, the electrode 110 is connected to the input side of the operational amplifier, and the electrode 120 is connected to the output side of the operational amplifier, for example. The control unit 200 calculates the electrical resistance value of the liquid F1, based on the output voltage of the operational amplifier, for example. Such a configuration may also be adopted.

5-5. In the resistance detection sensor 10 according to the above embodiment, a DC voltage is constantly applied between the electrodes 110 and 120. However, a DC voltage may not necessarily be constantly applied between the electrodes 110 and 120. For example, a switch capable of switching the electrical connection state between the electrodes (electrodes 110 and 120) and the DC power sources (positive power source V1, negative power source V2) may be provided, and this switch may be configured to be open, in a state where the AC voltage is applied between the electrodes 110 and 120.

5-6. Also, in the resistance detection sensor 10 according to the above embodiment, a fixed DC voltage is constantly applied between the electrodes 110 and 120. However, a fixed DC voltage does not necessarily need to be constantly applied between the electrodes 110 and 120. For example, at the timing at which the AC voltage is applied between the electrodes 110 and 120, the DC voltage that is applied between the electrodes 110 and 120 may be substantially 0 V.

Figure 8:
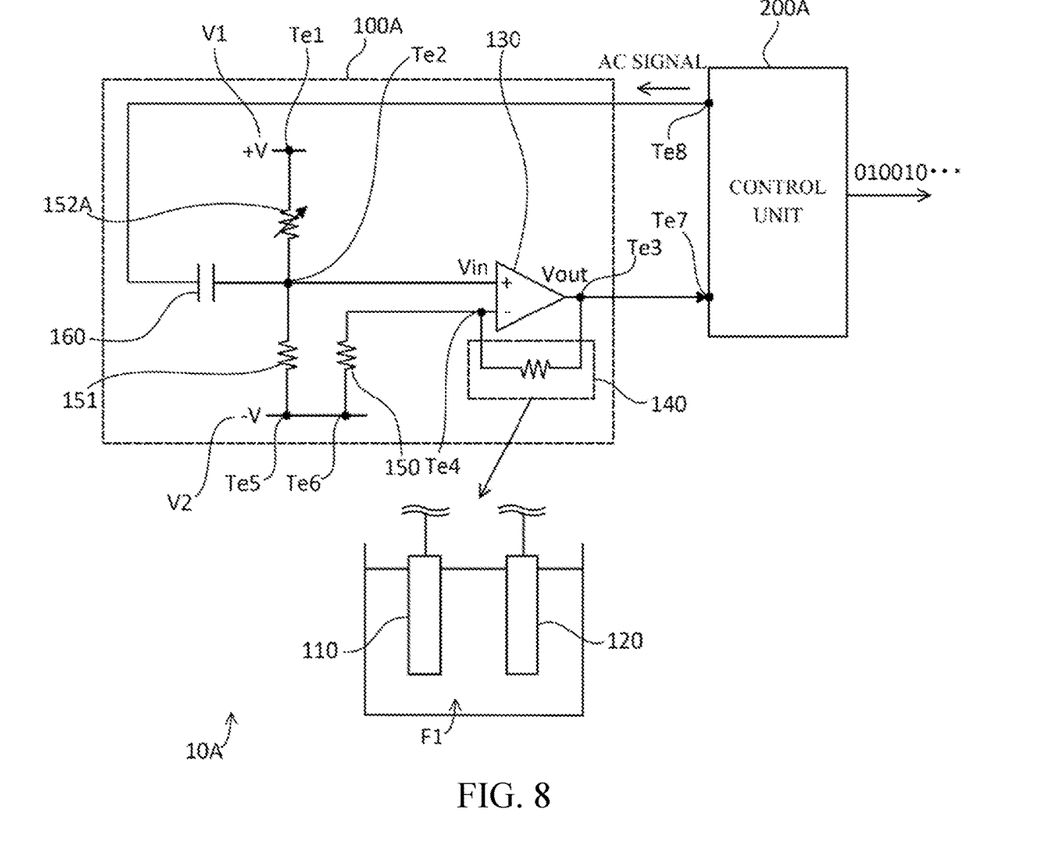
FIG. 8 is a diagram schematically showing an electrical configuration of part of a resistance detection sensor which is another embodiment.

FIG. 8 is a diagram schematically illustrating the electrical configuration of part of a resistance detection sensor 10A which is another embodiment. Note that, here, the description will focus on portions that differ from the resistance detection sensor 10 according to the above embodiment, and description of overlapping portions will not be repeated.

Referring to FIG. 8, the resistance detection sensor 10A is configured to detect the electrical resistance value of a liquid. The resistance detection sensor 10A includes a sensor unit 100A and a control unit 200A. The sensor unit 100A includes a resistor 152A. The resistor 152A is provided between terminals Te1 and Te2. The resistor 152A is constituted by a variable resistor. The electrical resistance value of the resistor 152A is controlled by the control unit 200A, for example. Note that, apart from including the resistor 152A instead of the resistor 152, the sensor unit 100A is similar in configuration to the sensor unit 100 in the above embodiment.

The control unit 200A includes a CPU, a RAM and a ROM, for example. The control unit 200A controls the constituent elements within the resistance detection sensor 10A, according to information processing, for example. The control unit 200A calculates the electrical resistance value of the liquid F1 based on the output voltage Vout of the operational amplifier 130 in a state where a DC voltage is applied between the electrodes 110 and 120, for example. Also, the control unit 200A controls the electrical resistance value of the resistor 152A. The input voltage Vin of the operational amplifier 130 thereby changes. Specifically, the control unit 200A controls the electrical resistance value of the resistor 152A such that the DC voltage that is applied between the electrodes 110 and 120 will be substantially 0 V, at the timing at which an AC voltage is applied between the electrodes 110 and 120. Note that means for making the DC voltage that is applied between the electrodes 110 and 120 substantially 0 V at the timing at which an AC voltage is applied between the electrodes 110 and 120 is not limited to means using a variable resistor.

Also, apart from controlling the electrical resistance value of the resistor 152A at the timing at which the AC voltage is applied between the electrodes 110 and 120, control by the control unit 200A is similar to control by the control unit 200 in the above embodiment. For example, in relation to the flowchart shown in FIG. 5, the only difference from the above embodiment is that, in step S120, the control unit 200A performs control of the resistor 152A such that the DC voltage that is applied between the electrodes 110 and 120 is substantially 0 V, along with performing control for applying an AC voltage between the electrodes 110 and 120.

Figure 9:
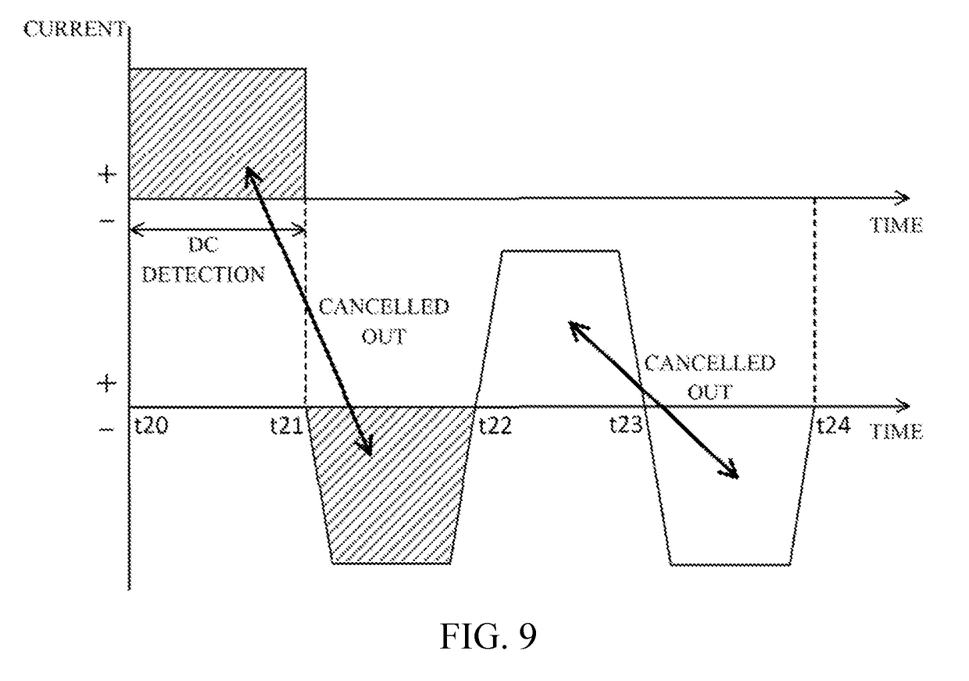
FIG. 9 is a diagram showing the transition of current in the case where a DC voltage that is applied between the electrodes is substantially 0 V at the timing at which an AC voltage is applied between the electrodes.

FIG. 9 is a diagram showing the transition of current in the case where the DC voltage that is applied between the electrodes 110 and 120 is substantially 0 V at the timing at which the AC voltage is applied between the electrodes 110 and 120. Referring to FIG. 9, the horizontal axis shows time and the vertical axis shows current. The upper portion of FIG. 9 shows the transition of direct current that is produced between the electrodes 110 and 120 during times t20 to t24. The lower portion of FIG. 9 shows the transition of alternating current that is produced between the electrodes 110 and 120 during times t20 to t24.

From times t20 to t21, only direct current is produced between the electrodes 110 and 120. That is, from times t20 to t21, only a DC voltage is applied between the electrodes 110 and 120, and an AC voltage is not applied between the electrodes 110 and 120. The control unit 200A calculates the electrical resistance value in the resistance detection unit 140 based on the output voltage Vout of the operational amplifier 130 from times t20 to t21.

From times t21 to t24, only alternating current is produced between the electrodes 110 and 120. That is, from times t21 to t24, only substantially an AC voltage is applied between the electrodes 110 and 120. From times t20 to t21, a DC voltage having a first polarity (positive polarity) is applied between the electrodes 110 and 120. From times t21 to t24, an AC voltage starting from a second polarity (negative polarity) opposite to the first polarity is applied between the electrodes 110 and 120.

The influence of the AC voltage on the polarization of both the electrodes 110 and 120 from times t22 to t23 is cancelled out by the influence of the AC voltage on the polarization of both the electrodes 110 and 120 from times t23 to t24. Also, the influence of the DC voltage on the polarization of both the electrodes 110 and 120 from times t20 to t21 is cancelled out by the influence of the AC voltage on the polarization of both the electrodes 110 and 120 from times t21 to t22.

That is, both the frequency and amplitude of the AC voltage that is applied between the electrodes 110 and 120 is set such that the influence of the DC voltage that is applied between the electrodes 110 and 120 on the polarization of the electrodes is canceled out, for example. Note that the influence of the DC voltage on the polarization of the electrodes need not necessarily be completely cancelled out by the AC voltage that is applied between the electrodes 110 and 120, and the influence of the DC voltage on the polarization of the electrodes need only be suppressed as much as possible. Such a configuration may be adopted.

5-7. In the resistance detection sensor 10 according to the above embodiment, the control unit 200 generates an electrical resistance value (digital signal) of the liquid F1 based on the output voltage Vout (analog signal) of the operational amplifier 130, and sequentially outputs the generated digital signal (electrical resistance value) to outside the resistance detection sensor 10. In this case, the control unit 200 may, for example, perform convolution of the generated electrical resistance value and sequentially output a digital signal indicating the convolution result to outside the resistance detection sensor 10. A decrease in detection accuracy that is based on the presence of outliers can thereby be suppressed.

5-8. In the resistance detection sensor 10 according to the above embodiment, the control unit 200 may collect the output voltage Vout of the operational amplifier 130 in the state where an AC voltage is applied between the electrodes 110 and 120, and perform various analysis, for example. For example, the frequency of the AC voltage that is applied between the electrodes 110 and 120 may be adjusted as appropriate, and analysis relating to the relation between the frequency of the AC voltage and the electrical resistance value of the liquid F1 may be performed.

Embodiments of the present invention are described above for illustrative purposes. That is, the detailed description and accompanying drawings are disclosed for illustrative purposes. Therefore, the constituent elements illustrated in the detailed description and accompanying drawings may include constituent elements that are not essential for solving the problem. Accordingly, those non-essential constituent elements should not be immediately construed as being essential simply because they are illustrated in the detailed description and accompanying drawings.

Also, the above embodiments are merely illustrative examples of the present invention in all respects. The above embodiments can be variously improved or modified within the scope of the invention. That is, in implementing the present invention, specific configurations can be adopted as appropriate according to the embodiment.

LIST OF REFERENCE NUMERALS

10 Resistance detection sensor
100 Sensor unit
110, 111, 120, 121 Electrode
130 Operational amplifier
140 Resistance detection unit
150, 151, 152 Resistor
160 Capacitor
200 Control unit
B1 Battery
F1 Liquid
GL1 Gas layer
SW1 Switch
Te1, Te2, Te3, Te4, Te5, Te6, Te1, Te8 Terminal
V1 Positive power source
V2 Negative power source

The invention claimed is:

1. A resistance detection sensor for detecting an electrical resistance value of a liquid, comprising:
a pair of electrodes immersed in the liquid;
a DC voltage application unit configured to apply a DC voltage having a first polarity between the pair of electrodes;
an AC voltage application unit configured to apply an AC voltage between the pair of electrodes; and
a control unit configured to calculate the electrical resistance value of the liquid, in a state where the DC voltage is applied between the pair of electrodes by the DC voltage application unit,
wherein the control unit controls the AC voltage application unit so as to apply an AC voltage starting from a second polarity opposite to the first polarity at a predetermined time interval between the pair of electrodes, and
a time period for which the AC voltage is applied between the pair of electrodes by the AC voltage application unit is not an integer multiple of a cycle of the AC voltage that is applied between the pair of electrodes.

2. The resistance detection sensor according to claim 1, wherein the time period for which an AC voltage is applied between the pair of electrodes by the AC voltage application unit is a time period consisting of a time period of an integer multiple of the cycle of the AC voltage that is applied between the pair of electrodes added to a time period of half the cycles of the AC voltage that is applied between the pair of electrodes.

3. The resistance detection sensor according to claim 1, further comprising:
an operational amplifier,
wherein, in the resistance detection sensor, an amplifier circuit including the operational amplifier is constituted,
one electrode of the pair of electrodes is connected to an input side of the operational amplifier, and the other electrode of the pair of electrodes is connected to an output side of the operational amplifier, and
the control unit calculates the electrical resistance value of the liquid based on an output voltage of the operational amplifier.

4. The resistance detection sensor according to claim 1, wherein a cycle in which calculation of the electrical resistance value of the liquid is performed is the same as a cycle in which the AC voltage is applied between the pair of electrodes.

5. The resistance detection sensor according to claim 1, wherein the liquid is a liquid lubricant.

6. The resistance detection sensor according to claim 2, further comprising:
an operational amplifier,
wherein, in the resistance detection sensor, an amplifier circuit including the operational amplifier is constituted,
one electrode of the pair of electrodes is connected to an input side of the operational amplifier, and the other electrode of the pair of electrodes is connected to an output side of the operational amplifier, and
the control unit calculates the electrical resistance value of the liquid based on an output voltage of the operational amplifier.

7. The resistance detection sensor according to claim 2, wherein a cycle in which calculation of the electrical resistance value of the liquid is performed is the same as a cycle in which the AC voltage is applied between the pair of electrodes.

8. The resistance detection sensor according to claim 2, wherein the liquid is a liquid lubricant.

\* \* \* \* \*